(12) United States Patent
Umino

(10) Patent No.: US 10,617,044 B2
(45) Date of Patent: Apr. 7, 2020

(54) IN-VEHICLE POWER CONVERSION DEVICE

(71) Applicant: Nissan Motor Co., Ltd., Yokohama-shi, Kanagawa (JP)

(72) Inventor: Tomohiro Umino, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 16/096,711

(22) PCT Filed: Apr. 28, 2016

(86) PCT No.: PCT/JP2016/063357
§ 371 (c)(1),
(2) Date: Oct. 26, 2018

(87) PCT Pub. No.: WO2017/187598
PCT Pub. Date: Nov. 2, 2017

(65) Prior Publication Data
US 2019/0159367 A1    May 23, 2019

(51) Int. Cl.
*H05K 7/20* (2006.01)
*H01L 23/473* (2006.01)
(Continued)

(52) U.S. Cl.
CPC ......... *H05K 7/20927* (2013.01); *H01L 23/34* (2013.01); *H01L 23/46* (2013.01); *H01L 23/473* (2013.01); *H01L 25/112* (2013.01); *H02G 5/10* (2013.01); *H02M 7/003* (2013.01); *H02M 7/44* (2013.01); *H02M 7/48* (2013.01); *H05K 5/0247* (2013.01); *H05K 7/1432* (2013.01);
(Continued)

(58) Field of Classification Search
CPC .................................................. H05K 7/20927
See application file for complete search history.

(56) References Cited

U.S. PATENT DOCUMENTS

| 6,588,647 B2 * | 7/2003 | Yamada | ............. H05K 7/20872 165/170 |
| 6,594,149 B2 * | 7/2003 | Yamada | ............. H05K 7/20872 165/170 |

(Continued)

FOREIGN PATENT DOCUMENTS

| JP | 63-16492 U   | 2/1988  |
| JP | 2000-315757 A | 11/2000 |

(Continued)

*Primary Examiner* — Robert J Hoffberg
(74) *Attorney, Agent, or Firm* — Global IP Counselors, LLP

(57) ABSTRACT

An in-vehicle power conversion device includes a drive unit, a casing and a plurality of busbars. The drive unit converts and transmits electric power. The casing includes electrical input-output parts and a main body. The main body includes a housing portion that houses the drive unit, and a lid body that closes the housing portion. The busbars electrically connect the drive unit and the electrical input-output parts of the casing to and from which electric power is inputted and outputted. The electrical input-output parts are routed outside of the casing. The busbars have heat-dissipating portions that are arranged along the casing to transfer heat to the casing outside of the housing portion.

21 Claims, 12 Drawing Sheets

(51) Int. Cl.
   *H05K 5/02*    (2006.01)
   *H02M 7/00*    (2006.01)
   *H02G 5/10*    (2006.01)
   *H01L 23/34*   (2006.01)
   *H01L 23/46*   (2006.01)
   *H02M 7/48*    (2007.01)
   *H01L 25/11*   (2006.01)
   *H05K 7/14*    (2006.01)
   *H02M 7/44*    (2006.01)
   *H01L 23/433*  (2006.01)
   *H01L 23/373*  (2006.01)
   *B60L 50/60*   (2019.01)
   *B60L 50/51*   (2019.01)

(52) U.S. Cl.
   CPC ......... *H05K 7/209* (2013.01); *H05K 7/20872* (2013.01); *B60L 50/51* (2019.02); *B60L 50/60* (2019.02); *B60L 2210/40* (2013.01); *B60L 2240/525* (2013.01); *H01L 23/3736* (2013.01); *H01L 23/3737* (2013.01); *H01L 23/4334* (2013.01)

(56) References Cited

U.S. PATENT DOCUMENTS

| | | | |
|---|---|---|---|
| 7,978,468 B2 * | 7/2011 | Nakatsu | H02M 7/003 361/689 |
| 8,355,244 B2 * | 1/2013 | Kimura | H05K 7/209 257/707 |
| 8,411,441 B2 * | 4/2013 | Nakatsu | H02M 7/003 361/699 |
| 2011/0249402 A1 | 10/2011 | Hentschel et al. | |
| 2013/0294040 A1 | 11/2013 | Fukumasu et al. | |
| 2018/0013355 A1 * | 1/2018 | Tokuyama | H01L 23/48 |

FOREIGN PATENT DOCUMENTS

| | | |
|---|---|---|
| JP | 2006-271063 A | 10/2006 |
| JP | 2009-296708 A | 12/2009 |
| JP | 2012-139016 A | 7/2012 |
| JP | 2012-253954 A | 12/2012 |
| JP | 2014-54065 A | 3/2014 |
| JP | 2016-163498 A | 9/2016 |

* cited by examiner

IN-VEHICLE POWER CONVERSION DEVICE

TECHNICAL FIELD

The present invention relates to an in-vehicle power conversion device, and in particular to busbar cooling technology.

BACKGROUND ART

Conventionally, in an in-vehicle power conversion device such as an inverter, it is known that connections between terminal parts where electrical power is input and output and a drive unit such as a capacitor or a semiconductor module, as well as connections between drive units, are achieved by means of a busbar.

A cooling structure in which a plurality of busbars are cooled by stacking a plurality of busbars on a cooling body via an insulating sheet in such an in-vehicle power conversion device is known (for example, refer to Patent Document 1). In the prior art, it is possible to forcibly cool a plurality of busbars.

PRIOR ART DOCUMENTS

Patent Documents

Patent Document 1: Japanese Laid-Open Patent Application No. 2006-271063

SUMMARY OF THE INVENTION

Problem to be Solved by the Invention

However, in such an in-vehicle power conversion device of the prior art, the connections between terminal parts and drive units, or the connections between drive units, are achieved inside a casing for housing drive units of the in-vehicle power conversion device.

Therefore, according to the prior art, because a cooling body on which busbars are stacked is placed inside the casing, the size of the casing is increased.

In light of the problem described above, an object of the present invention is to provide an in-vehicle power conversion device that can be reduced in size.

Means of Achieving the Object

The in-vehicle power conversion device of the present invention comprises one or more drive units that are housed in a housing portion inside a casing and that are driven by receiving supplied power, and a plurality of busbars connecting the drive units and terminal parts to which and from which electric power is input and output, in a state of being insulated with respect to the casing.

The in-vehicle power conversion device of the present invention is characterized in that the busbar is equipped with a heat-dissipating portion that is arranged along the casing so as to be capable of transferring heat to the casing outside of the housing portion.

Effects of the Invention

In the in-vehicle power conversion device of the present invention, heat generated by a busbar is transferred outside of the casing from heat-generating portions that are outside of the casing, and is also transferred to the casing with the casing acting as a heat sink; as a result, the busbar can be cooled.

In this manner, because the busbar dissipates heat outside of the casing and the casing is utilized as a heat sink, it is possible to reduce the size of the casing compared to the prior art in which a cooling body on which busbars are stacked is placed inside the casing.

EMBODIMENTS TO CARRY OUT THE INVENTION

Figure 1:
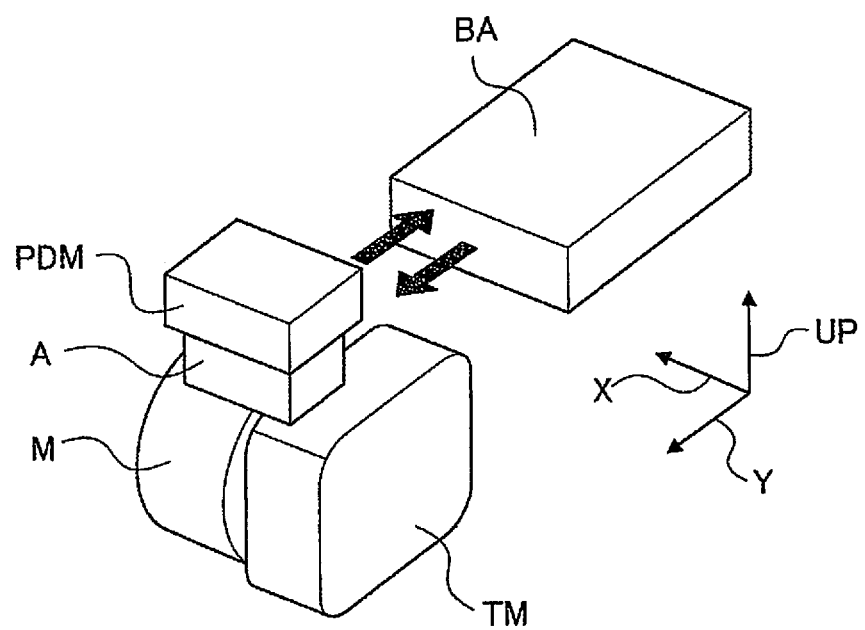
FIG. 1 is a perspective view illustrating a schematic structure of a drive unit of a vehicle equipped with an inverter as an in-vehicle power conversion device according to a first embodiment.

Preferred embodiments for realizing the in-vehicle power conversion device of the present invention are described below on the basis of the embodiments illustrated in the drawings.

Embodiment 1

The in-vehicle power conversion device according to the first embodiment will now be described.

The first embodiment is an example in which the present invention is applied to an inverter A as an in-vehicle power conversion device.

FIG. 1 is a perspective view illustrating the schematic structure of a drive unit of a vehicle equipped with the inverter A as an in-vehicle power conversion device according to the first embodiment. The inverter A is provided at the upper portion of a motor M as a vehicle-mounted drive source and drives the motor M by converting direct current, which is electric power from a battery (vehicle-mounted power supply) BA, into alternating current. In addition, when the motor M carries out regeneration as a generator, the inverter A converts the generated alternating current into direct current and supplies same to the battery BA.

The output shaft of the motor M (not shown) is connected to the transmission TM. Additionally, a secondary battery having a voltage control range of about several hundred volts (lithium-ion secondary battery, nickel hydrogen battery, or the like) is employed as the battery BA.

Furthermore, a power control module PDM including a converter that controls the supply of electric power is provided above the inverter A between the battery BA and the inverter A. The arrow UP in the drawing indicates the upper side of the vehicle, the arrow X indicates one horizontal direction (for example, the front side of the vehicle), and the arrow Y indicates a horizontal direction that is orthogonal to the arrow X (for example, the leftward direction of the vehicle). In addition, the orientation of the vertical direction and the orientation of the horizontal direction of the inverter A are merely examples, and these orientations are not limited to those shown in the drawing; the horizontal direction in the drawing can be in any direction, such as in the vertical direction, or turned upside down.

Next, the inverter A according to the first embodiment will be described in detail on the basis of FIGS. 2-5.

Figure 2:
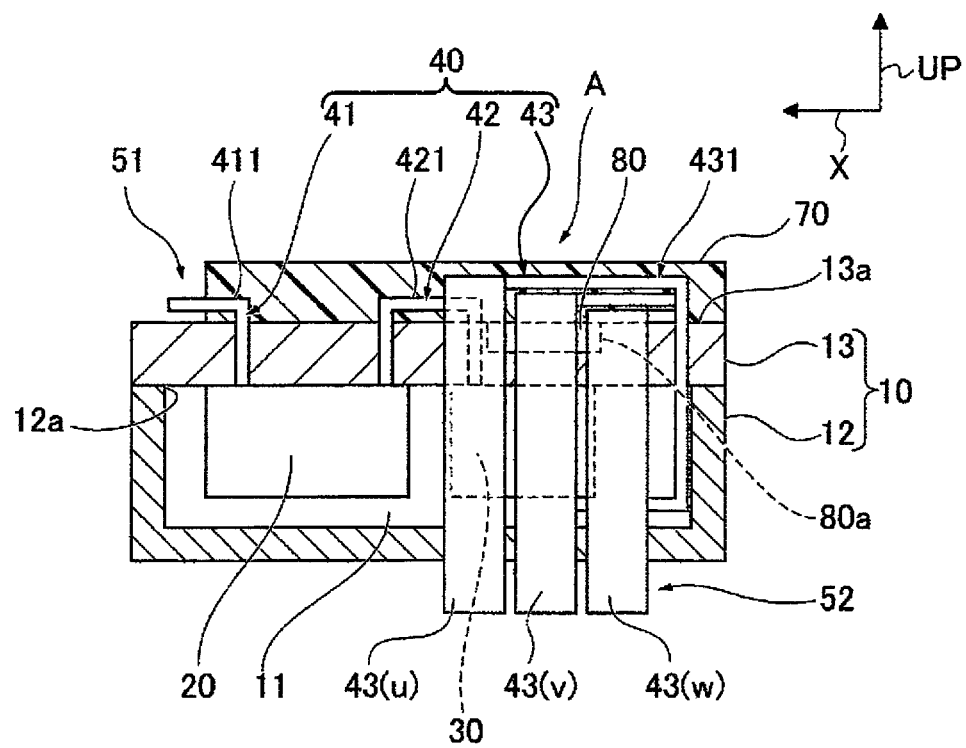
FIG. 2 is a cross-sectional view illustrating the inverter, showing a cross section through line S2-S2 of FIG. 4.
Figure 3:
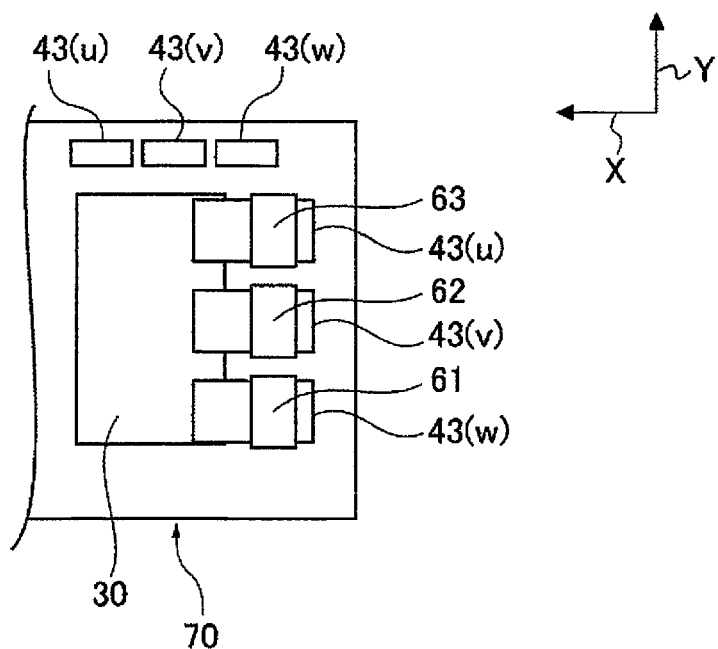
FIG. 3 is a bottom surface view of the main part of a lid body of the inverter.

FIG. 2 is a cross-sectional view illustrating the main part of the inverter A; the inverter A houses in a housing portion 11 on the inner side of a casing 10, a power module 30 and a smoothing capacitor 20 as a drive unit for converting and transmitting electric power and also as heat-generating parts.

The casing 10 includes a lid body 13 and a main body 12 made of metal. The main body 12 is formed in the shape of a bottomed rectangular box having an opening 12a at the top in the drawing, and the lid body 13 is formed in the shape of a rectangular plate that closes the opening 12a. Since at least the lid body 13 of the casing 10 also functions as a heat sink, as described below, the lid body is described here as being made of metal, but can be made from a resin that has excellent thermal conductivity. In addition, the main body 12 can be made from a resin that has low thermal conductivity.

The power module 30 and the smoothing capacitor 20 as a drive unit is attached on the lower surface of the lid body 13, which is the surface on the housing portion 11 side. As is known, the power module 30 comprises a plurality of switching elements on an upper arm and a on lower arm, and each switching element carries out an opening and closing operation according to a signal from a control circuit, which is not shown, and generates AC power having a plurality of phases (for example, three phases) for producing the desired rotational force of the motor M.

Additionally, the smoothing capacitor 20 suppresses voltage fluctuations caused by the switching operations of the power module 30.

The busbars 40 connect a motor-side terminal part 52 and a battery-side terminal part 51 as input/output units for inputting and outputting electric power, and connect the power module 30 and the smoothing capacitor 20 as a drive unit. The battery-side terminal part 51 is connected to the battery BA via the power control module PDM and inputs electric power to and outputs electric power from the battery BA. In addition, the motor-side terminal part 52 is connected to the motor M and inputs electric power to and outputs electric power from the motor M.

The busbars 40 include first busbars 41, second busbars 42, and third busbars 43. The first busbars 41 connect the battery-side terminal part 51 and the smoothing capacitor 20. The second busbars 42 connect the smoothing capacitor 20 and the power module 30. The third busbars 43 connect the power module 30 and the motor-side terminal part 52.

Figure 4:
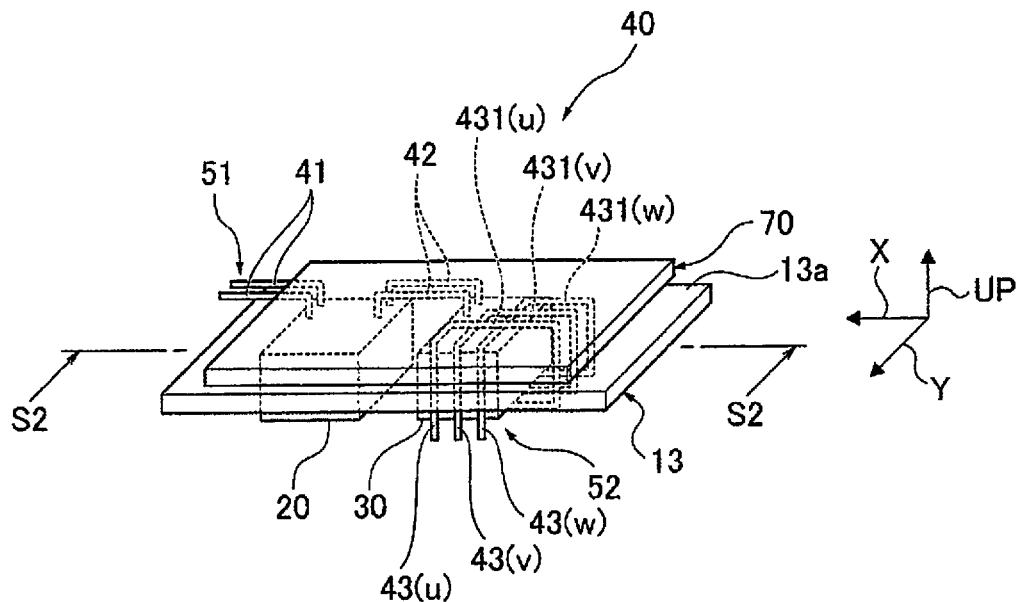
FIG. 4 is a perspective view illustrating the lid body, which is a main part of the inverter.
Figure 5:
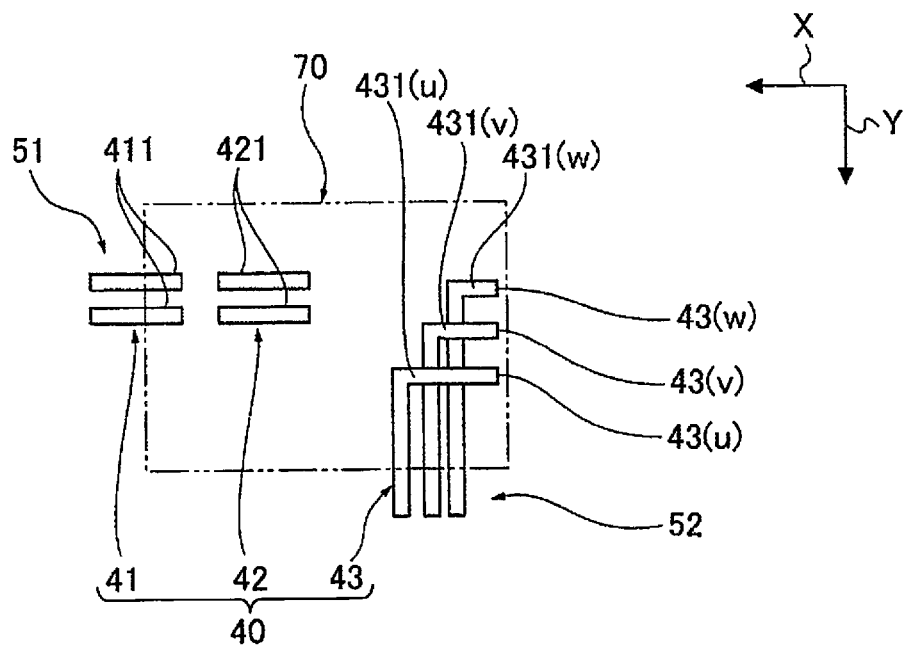
FIG. 5 is a plan view illustrating the arrangement of busbars (heat dissipation parts) in a busbar module of the inverter.

A pair of the first busbars 41 and a pair of the second busbars 42 are respectively provided for positive and negative, as illustrated in FIG. 4 and FIG. 5. In addition, three of the third busbars 43 are provided for the U, V, and W phases, and current sensors 61, 62, 63 are respectively provided thereon (refer to FIG. 3). The third busbars 43 are given the reference designators (u), (v), (w) in the drawing to distinguish each phase, but these designators, (u), (v), (w), are omitted when phase is referred to collectively in the Specification.

Furthermore, the first busbar 41, the second busbar 42, and the third busbar 43 are respectively provided with heat-dissipating portions 411, 421, 431 arranged along the upper surface 13a of the lid body 13 outside of the housing portion 11. Each of the heat-dissipating portions 411, 421, 431 arranged in a rectangular plate-shaped busbar module 70 that is integrally formed with an insulating resin to insulate with respect to the casing 10.

The routing structure of each of the busbars 41, 42, 43 will be described in detail below.

One end portion of the first busbar 41 projects in a first direction (x direction), which is one direction of the rectangle of the busbar module 70 in the horizontal direction, and forms the battery-side terminal part 51, as illustrated in FIG. 2. The first busbar 41 is then routed in the (−) x direction of the busbar module 70, suspended downward from a position above an end portion of the smoothing capacitor 20 in the first direction (end portion on the (+) side of the x direction), and connected to the upper portion of the smoothing capacitor 20 at the end portion on the (+) side of the x direction.

The second busbar 42 connects the upper portion of the smoothing capacitor 20 at the end portion on the (−) side of the x direction with the upper portion of the power module 30 at the end portion on the (+) side of the x direction. Thus, the second busbar 42 extends from the upper portion of the smoothing capacitor 20 upward to the inside of the busbar module 70, extending horizontally inside the busbar module 70 in the (−) direction of the x direction to the position of the power module 30, and then suspended downward, to be routed in the approximate form of an inverted-U, as illustrated in FIG. 2.

The portions of the first busbar 41 and the second busbar 42 that are routed along the upper surface 13a of the lid body 13 in the busbar module 70 outside of the housing portion 11 are the heat-dissipating portions 411, 421.

Next, the third busbar 43 will be described in detail.

The third busbar 43 connects the bottom portion of the power module 30 at the end portion on the (−) side of the x direction, which is the first direction of the horizontal direction, to the motor-side terminal part 52, which is disposed at the end portion of the inverter A on the (+) side of the y direction, which is a second direction of the horizontal direction orthogonal to the first direction. That is, the connection position with the third busbar 43 in the power module 30 is defined by the arrangement of elements in the power module 30. On the other hand, the position of the motor-side terminal part 52 is defined by the arrangement and the connecting position of the motor M when mounted in the vehicle. In this manner, when routing so as to connect two differently oriented locations (the end portion in the x direction and the end portion in the y direction), the third busbar 43 is not disposed inside the housing portion 11, but is disposed using the outside of the housing portion 11.

That is, the third busbar 43 rises above the connection with the power module 30 and extends through the lid body 13, and then bends toward the + side of the x direction above the lid body 13 and is routed along the upper surface 13a, as illustrated in FIG. 2. Furthermore, the portion (heat-dissipating portion 431) that is routed in the horizontal direction along the upper surface 13a of this lid body 13 is bent at a right angle and extends in the y direction, so as to be disposed above the power module 30, as illustrated in FIG. 4 and FIG. 5. The third busbar is bent downward in a position above the motor-side terminal part 52, extends through the lid body 13, returns inside the housing portion 11, and extends to the motor-side terminal part 52.

In the third busbar 43, formed as described above, the portion disposed on the outside of the housing portion 11 is the heat-dissipating portion 431, which, in the busbar module 70, is bent into the form of an L in the direction (horizontal direction) along the rectangular plate surface of the busbar module 70.

In this manner, when forming the heat-dissipating portion 431 into an L shape, in the first embodiment, the connection positions with the U-V-W phase power module 30 and the arrangement of the motor-side terminal part 52 are set such that the three heat-dissipating portions 431 are essentially equal in length.

That is, when the UVW phases of the power module 30 to be connected are arranged with the third busbars 43, the phase that is closest to the end portion of the busbar module 70 in the y direction is arranged to be farthest in the x direction at the motor-side terminal part 52, as illustrated in FIG. 5. As a result, the heat-dissipating portions 431 (u), 431 (v), and 431 (w), which are essentially in the form of an L as viewed from above, become essentially equal in length. Since the heat-dissipating portions 431 (u), 431 (v), and 431 (w) are arranged so as to cross each other when viewed from above in this manner, the heat-dissipating portions 431 (u), 431 (v), and 431 (w) are arranged at different heights to ensure insulation, as illustrated in FIG. 2 and FIG. 4.

Returning to FIG. 2, the lid body 13 as a heat sink comprises a refrigerant flow path 80 for circulating a refrigerant (for example, cooling water) for cooling the lid body 13, and this refrigerant flow path 80 is sandwiched between the power module 30 from above and the heat-dissipating portion 431 from below.

Additionally, in the first embodiment, the refrigerant flow path 80 is formed between the lid body 13 and the busbar module 70.

Figure 6:
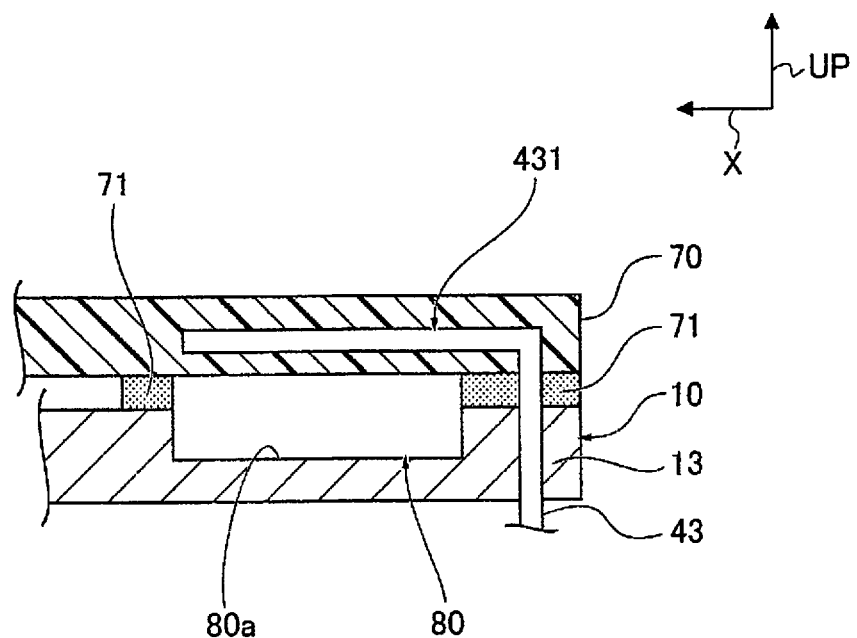
FIG. 6 is a cross-sectional view illustrating the main part of the inverter.

That is, a recessed groove 80a for forming the refrigerant flow path 80 is formed on the upper surface 13a of the lid body 13, and the refrigerant flow path 80 is formed by the busbar module 70 covering and closing the opening portion of this recessed groove 80a, as illustrated in FIG. 6.

Furthermore, the refrigerant flow path 80 and the third busbars 43 are sealed by an adhered portion 71 in which the resin portion of the busbar module 70 is adhered to the lid body 13. That is, when the busbar module 70 is fixed to the lid body 13, the busbar module 70 is adhered to the lid body 13 along the entire length of the refrigerant flow path 80 at positions outside of the refrigerant flow path 80 in the horizontal direction of the busbar module 70, to form an adhered portion 71. In addition, insulation from the outside is ensured by also forming an adhered portion 71 around the third busbar 43. Although not shown, it is preferable to ensure insulation also around the first busbar 41 and the second busbar 42 by forming an adhered portion 71.

Actions of the First Embodiment

The inverter A converts DC power from the battery BA to AC power and transmits the AC power to the motor M via the power control module PDM. In addition, the inverter converts AC power generated by regeneration in the motor M to DC power and transmits the DC power to the battery BA via the power control module PDM.

Accompanying such an operation of the inverter A, each of the busbars 41, 42, 43, which form the busbar 40, becomes heated due to self-heating. In the first embodiment, each of the busbars 41, 42, 43 can be cooled by dissipating heat to the outside of the casing 10 at the respective heat-dissipating portions 411, 421, 431, and absorbing the heat with the lid body 13.

In addition, the lid body 13 is also in contact with the smoothing capacitor 20 and the power module 30, and also carries out cooling of the smoothing capacitor 20 and the power module 30.

In particular, although a large amount of heat is generated in the third busbars 43 having a long length, since a refrigerant flow path 80 is provided in order to circulate a refrigerant in the heat-dissipating portions 431 of the third busbars 43, it is possible to obtain higher cooling performance compared to cooling by simply using a metal lid body 13 as a heat sink. In the same manner, the power module 30 is able to obtain higher cooling performance by means of the refrigerant flow path 80.

In addition, upon routing from the end portion of the power module 30 on the (−) side of the x direction to the motor-side terminal part 52 at the end portion of the inverter A on the (+) side of the y direction, since the third busbars 43 are disposed on the outside of the housing portion 11, it is possible to suppress the volume of the housing portion 11 to reduce the size of the casing 10. In addition, it is not necessary to secure a space for installing a heat sink in the housing portion 11, or to arrange the orientation of the power module 30 in a position that takes into consideration connections to the motor M. Therefore, it is possible to obtain a high degree of design flexibility.

The heat-dissipating portions 431 of the third busbars 43 make up the busbar module 70 integrally with an insulating resin, and the heat-dissipating portions 431 are able to ensure the strength of the busbar module 70 as the skeleton of the busbar module 70. Furthermore, since the three third busbars 43 are juxtaposed horizontally and the heat-dissipating portions 431 are bent into the form of an L, it is possible to increase the strength of the busbar module 70 compared to cases in which the third busbars 43 are stacked, or juxtaposed linearly in the horizontal direction. In addition, since the heat-dissipating portions 431 are of equal length and are arranged in intersecting fashion in the horizontal direction, it is possible to achieve a uniform electrical resistance of the third busbars 43 and to further enhance the rigidity of the busbar module 70.

Furthermore, since the busbar module 70 also serves as a lid member for the refrigerant flow path 80, compared to when the lid member for the refrigerant flow path 80 is formed separately, it is possible to reduce the cost and to improve the cooling performance by means of the heat-dissipating portions 431 of the third busbars 43 coming into contact with the refrigerant flow path 80 via the insulating resin.

Effects of the First Embodiment

The effects of the first embodiment will be listed below.

1) The inverter A according to the first embodiment is an in-vehicle power conversion device comprising:

a casing 10 that houses a drive unit (smoothing capacitor 20, power module 30) for converting and transmitting electric power in a housing portion 11; and a plurality of busbars 40 that connect an input-output part (battery-side terminal part 51, motor-side terminal part 52), to and from which electric power is input and output, with the drive unit (smoothing capacitor 20, power module 30) of the casing 10, wherein the busbars 40 (first busbar 41, second busbar 42, third busbar 43) comprise heat-dissipating portions 411, 421, 431 that are arranged along the casing 10 so as to be capable of transferring heat to the casing 10 outside of the housing portion 11.

Therefore, the heat of the busbars 40 due to self-heating is dissipated to the outside of the casing 10 from the heat-dissipating portions 411, 421, 431, which are disposed outside of the casing 10, and the heat-dissipating portions are cooled with the casing 10 (lid body 13) acting as a heat sink, thereby enabling the generation of heat by the busbars 40 to be suppressed. In addition, since the heat-dissipating portions 411, 421, 431 are arranged on the outside of the housing portion 11, compared to the case in which the busbars 41, 42, 43 are disposed inside of the housing portion 11, it is possible to conserve the space of the housing portion 11, reduce the size of the inverter A, and to improve design flexibility.

2) In the inverter A of the first embodiment, the casing 10 includes the main body 12 that forms the housing portion 11, and a lid body 13 for closing an opening 12*a* of this main body 12, and the heat-dissipating portions 411, 421, 431 are arranged along the lid body 13.

By disposing the heat-dissipating portions 411, 421, 431 on the lid body 13 that can move relative to the main body 12, the process of forming connections to the outside of the inverter A becomes a simple matter. In particular, in the first embodiment, since a smoothing capacitor 20 and a power module 30 are provided on the lid body 13, the process of forming connections between these components and the heat-dissipating portions 411, 421, 431 is also a simple matter.

3) In the inverter A of the first embodiment, the drive unit (smoothing capacitor 20, power module 30) is provided so as to be capable of transferring heat to the lid body 13, which acts as a portion (heat sink portion) to which heat is transferred from the heat-dissipating portions 411, 421, 431 of the casing 10.

Therefore, the lid body 13, as a heat sink for the heat-dissipating portions 411, 421, 431, also serves as a heat sink for the drive unit (smoothing capacitor 20, power module 30). Therefore, compared to the case in which a heat sink for the drive unit is provided separately, it is possible to reduce costs and conserve space.

4) In the inverter A of the first embodiment, the heat-dissipating portions 411, 421, 431 form a busbar module 70 that is integrated with an insulating body that insulates.

Therefore, it is possible to ensure an insulating effect even when the heat-dissipating portions 411, 421, 431 are disposed outside of the housing portion 11. Additionally, by forming each of the heat-dissipating portions 411, 421, 431 as an integrally molded article made of resin, design flexibility becomes high, and, compared to a case in which the insulating body is formed separately, manufacturing and installation become a simple matter. Furthermore, by arranging the plurality of heat-dissipating portions 411, 421, 431 in parallel in the busbar module 70, the rigidity of the busbar module 70 is increased, and the strength and durability become excellent.

5) In the inverter A of the first embodiment, the busbar module 70 is formed in a plate shape, and the heat-dissipating portions 431 (*u*), 431 (*v*), 431 (*w*) are arranged in parallel inside the busbar module 70, and are bent into the form of an L in directions along the plate surface of the busbar module 70.

by forming the heat-dissipating portions 431 (*u*), 431 (*v*), and 431 (*w*) into an L shape, compared to a case in which the heat-dissipating portions 431 are not bent, the rigidity of the busbar module 70 is increased, and the strength and durability are further improved.

6) In the inverter A of the first embodiment, the plurality of heat-dissipating portions 431 (*u*), 431 (*v*), and 431 (*w*), which are bent into the form of an L, are arranged to cross each other in a direction along the plate surface, while the positions thereof are varied along a direction orthogonal to the direction along the plate surface of the busbar module 70, such that the total lengths thereof are essentially equal.

Therefore, in addition to effect 5) described above, by forming the heat-dissipating portions 431 (*u*), 431 (*v*), and 431 (*w*) so as to be of equal length, it is possible to achieve uniform electrical resistance of the third busbars 43, and to further enhance the rigidity of the busbar module 70.

7) In the inverter A of the first embodiment, the casing 10 is provided with a refrigerant flow path 80 in a portion (heat sink portion) to which heat is transferred from the heat-dissipating portion 431.

In this manner, by providing the casing 10 with a refrigerant flow path 80, it is possible to further improve the cooling performance of the heat-dissipating portion 431.

8) In the inverter A of the first embodiment, the heat-dissipating portion 431 (busbar module 70) also serves as a lid member for covering the refrigerant flow path 80.

In this manner, since the heat-dissipating portion 431 (busbar module 70) also serves as a lid member for the refrigerant flow path 80, it is possible to reduce costs by omitting a dedicated lid member, as well as to improve the cooling performance compared with the case in which the lid member is interposed between the heat-dissipating portion 431 and the refrigerant flow path 80.

9) In the inverter A of the first embodiment, a joint portion (adhered portion 71) is provided between the casing 10 (lid body 13) and the heat-dissipating portion 431 (busbar module 70) to join the two together and seal the refrigerant flow path 80.

Therefore, a sealing member for the refrigerant flow path 80 as well as a fastening tool for ensuring the sealing function become unnecessary, which leads to a cost reduction due to a decreased parts count, and improved spatial utilization and production, due to a reduction in the required installation space for parts and in the number of assembly steps.

10) In the inverter A of the first embodiment, the joint portion is a adhered portion 71 formed by adhering the insulating resin of the busbar module 70, in which the heat-dissipating portions 411, 421, 431, and the insulating resin for insulating the heat-dissipating portion 431 are integrated.

Therefore, in addition to effect 8) described above, since the busbar module 70 is an integrated article of resin, there is a high degree of molding freedom, and it is possible to form the module into the desired shape. In particular, it is possible to form the module into the required shape and obtain the desired sealing property, in order to realize sealing performance as a lid member for closing the refrigerant flow path 80. It also becomes possible to reduce costs compared to the case in which an adhesive is used as the joint portion.

11) In the inverter A of the first embodiment, the refrigerant flow path 80 is disposed sandwiched between the heat-dissipating portion 431 and the power module 30 as the drive unit.

Therefore, it is possible to cool the heat-dissipating portion 431 and to cool the drive unit (power module 30) with a single refrigerant flow path 80, so that it is possible carry out efficient cooling.

OTHER EMBODIMENTS

Next, inverters as in-vehicle power conversion devices of other embodiments will be described.

In the descriptions of the other embodiments, those configurations that are common to the configurations described above have been assigned the same reference symbols and only the differences therefrom will be described.

Embodiment 2

Figure 7:
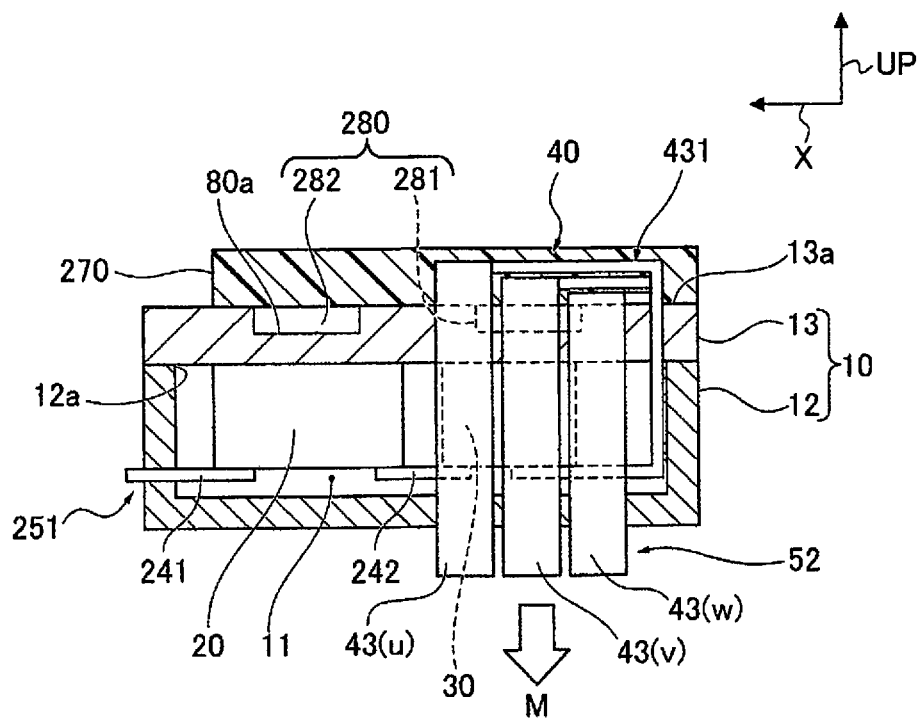
FIG. 7 is a cross-sectional view illustrating the inverter as an in-vehicle power conversion device according to a second embodiment.
Figure 8:
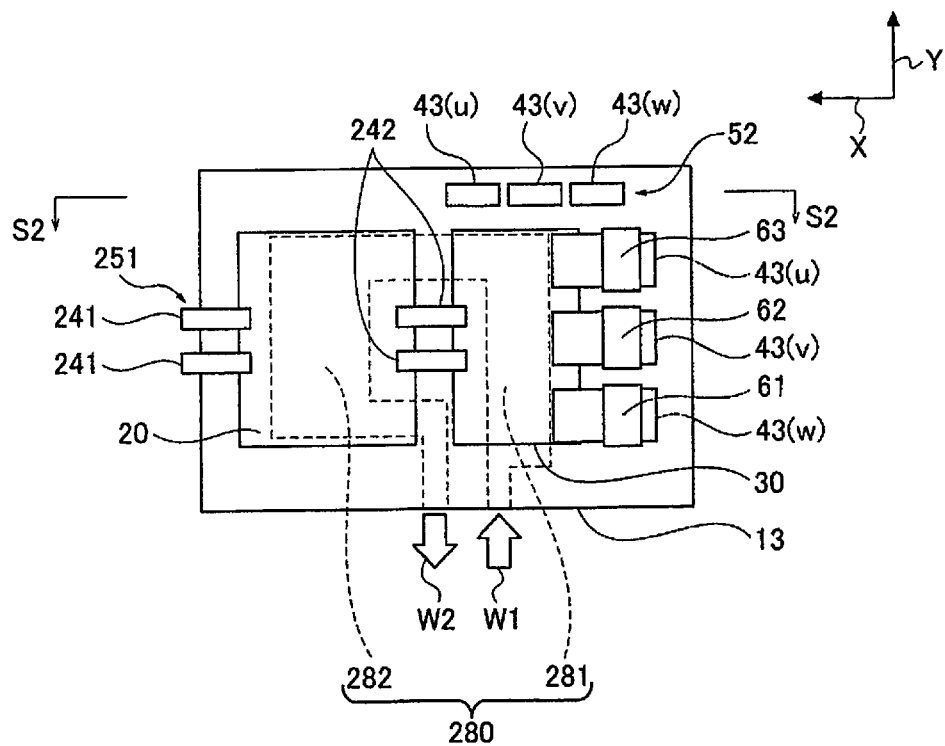
FIG. 8 is a bottom surface view of the main part of the lid body of the inverter.

The second embodiment is different than the first embodiment with respect to the routing of the first busbar 241 and the second busbar 242, and the configuration of the refrigerant flow path 280, and is described below on the basis of FIG. 7 and FIG. 8. FIG. 7 is a cross-sectional view illustrating the inverter according to the second embodiment, and FIG. 8 is a bottom surface view of the lid body of the inverter according to the second embodiment.

One end of the first busbar 241 is connected to the bottom portion of the smoothing capacitor 20 at an end portion in the first direction (end portion on the (+) side of the x direction), and the other end projects from a side surface of the main body 12 and forms the motor-side terminal part 251, as illustrated in FIG. 7.

In addition, the second busbar 242 connects the bottom portion of the smoothing capacitor 20 at an end portion in the first direction (end portion on the (−) side of the x direction) to the end portion of the power module 30 in the first direction (end portion on the (+) side of the x direction).

Therefore, the busbar module 270 is integrally formed into a plate shape by the heat-dissipating portion 431 of the third busbar 43 and the insulating resin.

The refrigerant flow path 280 includes a first flow path 281 disposed sandwiched between the power module 30 and the heat-dissipating portion 431 from above and below, and a second flow path 282 disposed above the smoothing capacitor 20. The first flow path 281 and the second flow path 282 can be formed independently; however, in the first embodiment, as indicated by the dotted line in FIG. 8, the two flow paths 281, 282 are linked to form one refrigerant flow path 280. In FIG. 8, arrow W1 indicates the inflow side of the refrigerant, and arrow W2 indicates the outflow side of the refrigerant.

The busbar module 270 then closes the first flow path 281 and the second flow path 282 of the refrigerant flow path 280.

2-1) In the inverter of the second embodiment, the refrigerant flow path 280 includes a first flow path 281 provided on the lid body 13 sandwiched between the power module 30 and the heat-dissipating portion 431, and a second flow path 282 provided on the lid body 13 disposed above the smoothing capacitor 20.

Therefore, it is possible to cool the heat-dissipating portion 431, to cool the power module 30, and to cool the smoothing capacitor 20 with a single refrigerant flow path 280, so that it is possible carry out efficient cooling.

2-2) In the inverter of the second embodiment, the refrigerant flow path 280 includes a second flow path 282 for cooling the smoothing capacitor 20 as a heat-generating part housed in the housing portion 11, and the busbar module 70, including the heat-dissipating portion 431, also serves as a lid member of the second flow path 282.

Therefore, since the busbar module 70 also serves as a lid member of two flow paths (first flow path 281, second flow path 282) constituting the refrigerant flow path 280, it is possible to reduce costs and conserve space, compared with the case in which lid members for closing the flow paths 281, 282 are provided separately for each path. In addition, since the busbar module 70 is integrally molded with an insulating resin that insulates the heat-dissipating portion 431 of the busbar 40, it is possible for the busbar to be formed in a shape that enables the refrigerant flow path to be closed by one member, even if the refrigerant flow path 280 is formed bent in two-dimensional fashion that includes first and second flow paths 281, 282.

Embodiment 3

Figure 9:
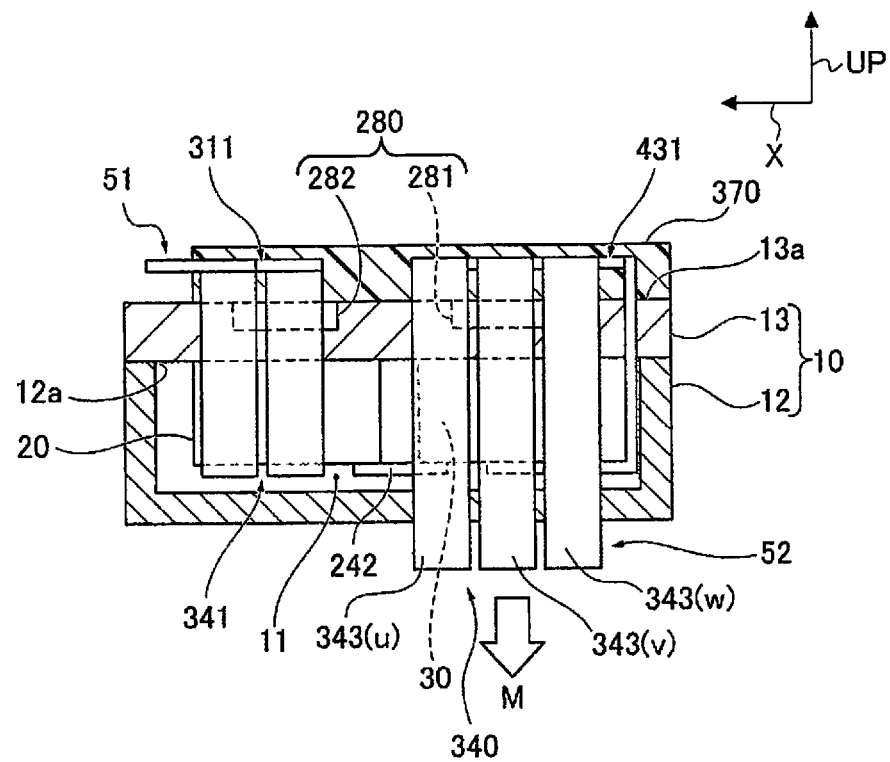
FIG. 9 is a cross-sectional view illustrating the main part of the inverter as an in-vehicle power conversion device according to a third embodiment, showing a cross section through line S9-S9 of FIG. 10.

The third embodiment is a modified example of the routing state of the busbars, and differs from the first embodiment in terms of the routing state of the first busbar 341 and the third busbar 343, which is described below on the basis of FIG. 9 and FIG. 10. FIG. 9 is a cross-sectional view of the main part of the inverter according to the third embodiment as viewed from the side (taken through S9-S9 of FIG. 9), and FIG. 10 is a perspective view illustrating the lid body of the inverter.

Figure 10:
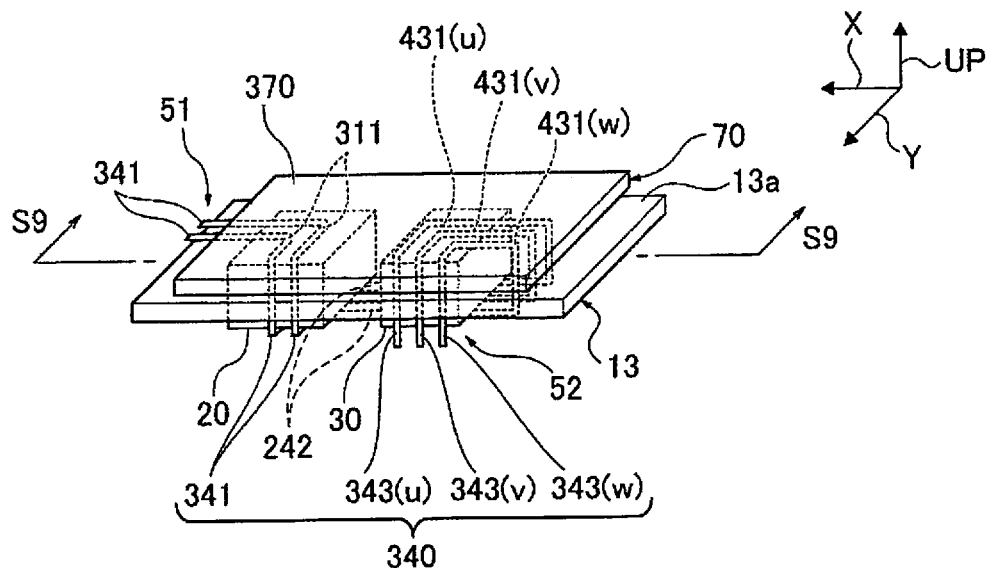
FIG. 10 is a perspective view of a lid portion, which is the main part of the inverter according to the third embodiment.

In the third embodiment, the heat-dissipating portions 311 of the first busbars 341 are in the form of an L bent from a first direction (x direction) toward a second direction (y direction) in the busbar module 370 so as to bypass the second flow path 282, as illustrated in FIG. 9 and FIG. 10. Then, the first busbars 341 are connected to an end portion of the smoothing capacitor 20 in the second direction (y direction). The second busbars 242 are routed in the same manner as in the second embodiment.

In addition, the third busbars 343 are arranged on the same horizontal plane without intersecting, as illustrated in FIG. 10. That is, the arrangement of the U, V, and W phases in the power module 30 is the reverse of that of the first embodiment, the arrangement being in the order of W, V, and U from the center to the end portion of the busbar module 370 in the y direction.

Therefore, in the third embodiment, in the busbars 340, the first busbars 341 and the third busbars 343 are respectively cooled at the heat-dissipating portions 311, 431. Furthermore, the heat-dissipating portions 311 of the first busbars 341 are efficiently cooled by a refrigerant that flows in the second flow path 282 of the refrigerant flow path 280.

Additionally, in the third embodiment, the heat-dissipating portions 431 are also arranged in parallel in the busbar module 70, and are bent into the form of an L in directions along the plate surface of the busbar module 70.

Therefore, as described in 4) above, compared with a case in which the heat-dissipating portions 431 are straight, the rigidity of the busbar module 70 is increased, and the strength and durability are further improved.

Embodiment 4

Figure 11:
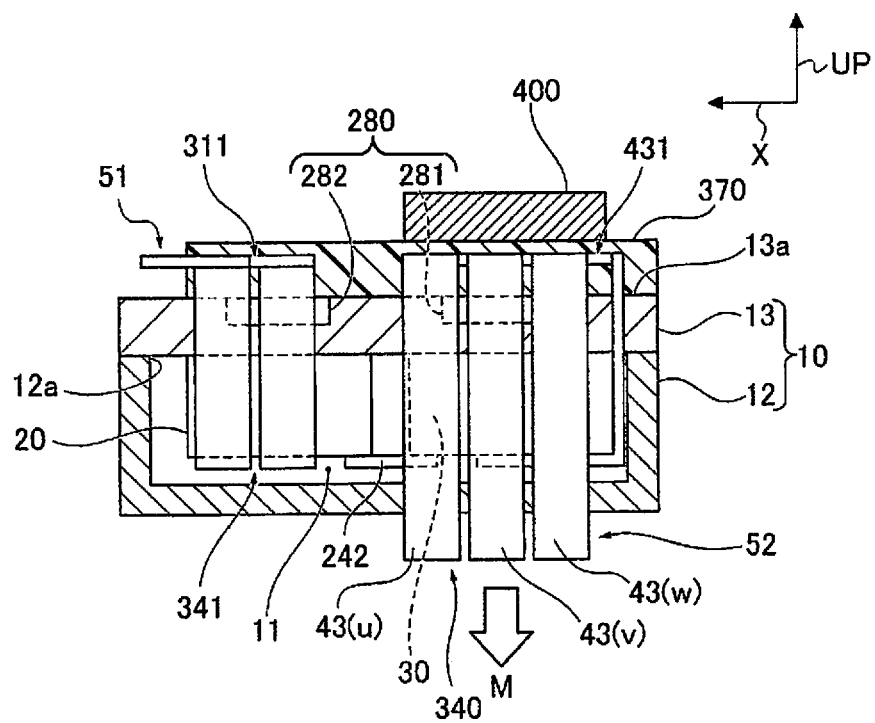
FIG. 11 is a cross-sectional view illustrating a main part of the inverter as an in-vehicle power conversion device according to a fourth embodiment.
Figure 12:
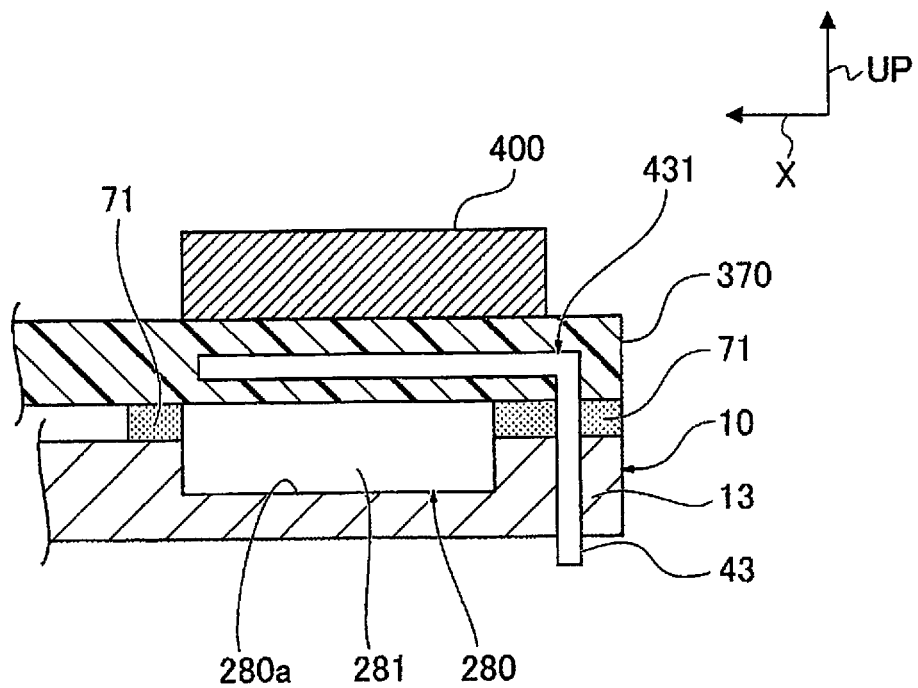
FIG. 12 is an enlarged cross-sectional view of the main part of FIG. 11.

The fourth embodiment is a modified example of the third embodiment and an example in which a heat sink 400 is further added to the upper portion of the busbar module 370, which is described below on the basis of FIG. 11 and FIG. 12. FIG. 11 is a cross-sectional view illustrating the main part of an inverter as an in-vehicle power conversion device according to the fourth embodiment, and FIG. 12 is an enlarged cross-sectional view of the main part of FIG. 11.

The heat sink 400 has a rectangular parallelepiped shape disposed above the heat-dissipating portions 431 and is formed from an insulating material having excellent heat conductivity, such as a ceramic. Therefore, in the fourth embodiment, the heat-dissipating portions 431 of the third busbars 43 are cooled by the first flow path 281 of the refrigerant flow path 280 and the heat sink 400.

4-1) In the inverter of the fourth embodiment, the busbar module 270 further comprises a heat sink 400 that absorbs the heat of the heat-dissipating portions 431 and dissipates the heat to the outside along the heat-dissipating portions 431. Therefore, it is possible to further increase the cooling effect of the heat-dissipating portions 431.

Embodiment 5

Figure 13:
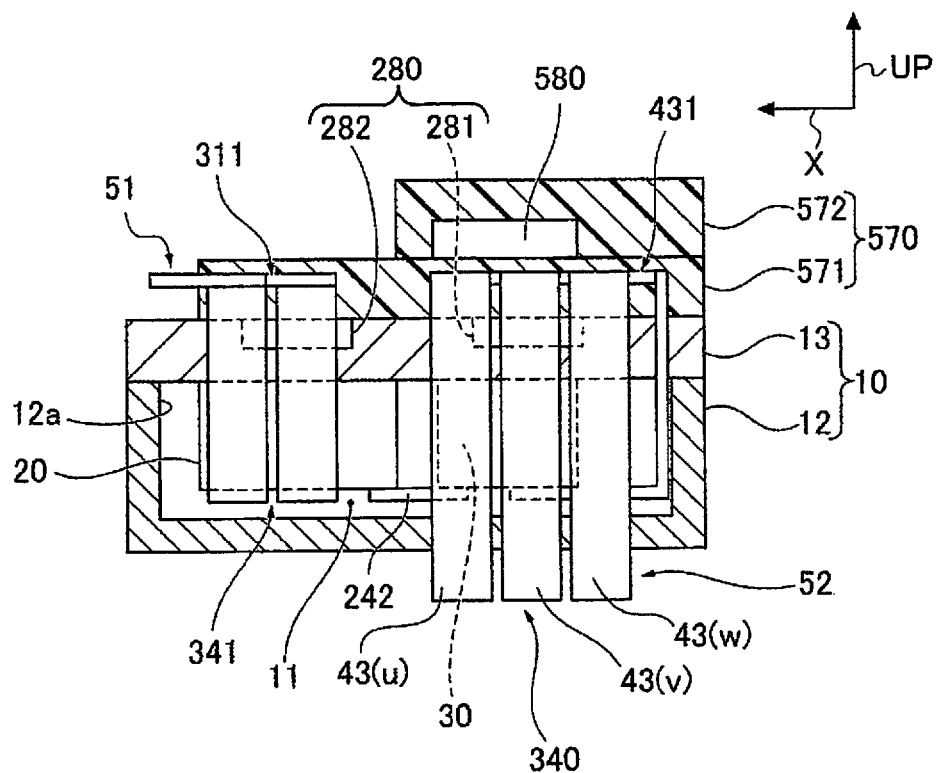
FIG. 13 is a cross-sectional view illustrating the main part of the inverter as an in-vehicle power conversion device according to a fifth embodiment.

The fifth embodiment is a modified example of the third embodiment, which is described below on the basis of FIG. 13 and FIG. 14. FIG. 13 is a cross-sectional view illustrating a main part of an inverter as an in-vehicle power conversion device according to the fifth embodiment, and FIG. 14 is an enlarged cross-sectional view of the main part of FIG. 13.

The busbar module 570 includes a module main body 571 that is similar to the busbar module 370, and a resin member 572 formed from an insulating resin fixed on the upper side of this module main body 571, as illustrated in FIG. 13.

The resin member 572 includes an upper side refrigerant flow path 580 instead of a heat sink 400, and the heat-dissipating portions 431 are sandwiched between the upper side refrigerant flow path 580 and the first flow path 281.

Figure 14:
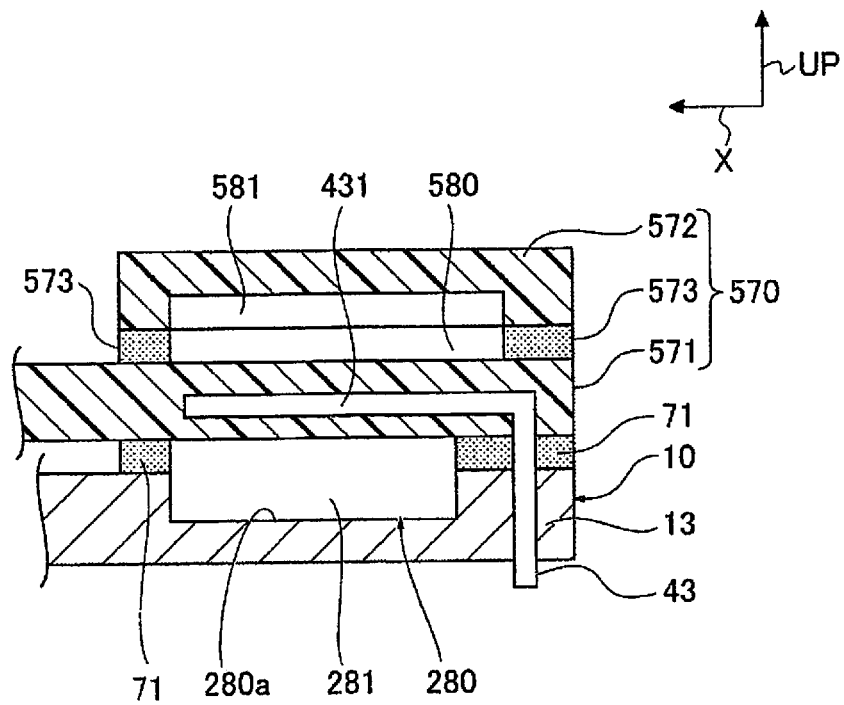
FIG. 14 is an enlarged cross-sectional view of the main part of FIG. 13.

This resin member 572 comprises a recessed portion 581 that forms the upper side refrigerant flow path 580, as illustrated in FIG. 14. Furthermore, the resin member 572 comprises a adhered portion 573 in which the peripheral portion of the upper side refrigerant flow path 580 is adhered to the module main body 571, and the upper side refrigerant flow path 580 is sealed by the adhered portion 573.

Therefore, in this fifth embodiment, the heat-dissipating portions 431 are cooled from above and below by the refrigerant flow path 280 (first flow path 281) and the upper side refrigerant flow path 580, and the cooling performance of the heat-dissipating portions 431 is further improved.

5-1) In the inverter of the fifth embodiment, the busbar module 570 comprises an upper side refrigerant flow path 580 on the opposite side of the refrigerant flow path 280 (first flow path 281) across from the heat-dissipating portions 431.

Therefore, it is possible to further increase the cooling effect of the heat-dissipating portions 431.

Embodiment 6

Figure 15:
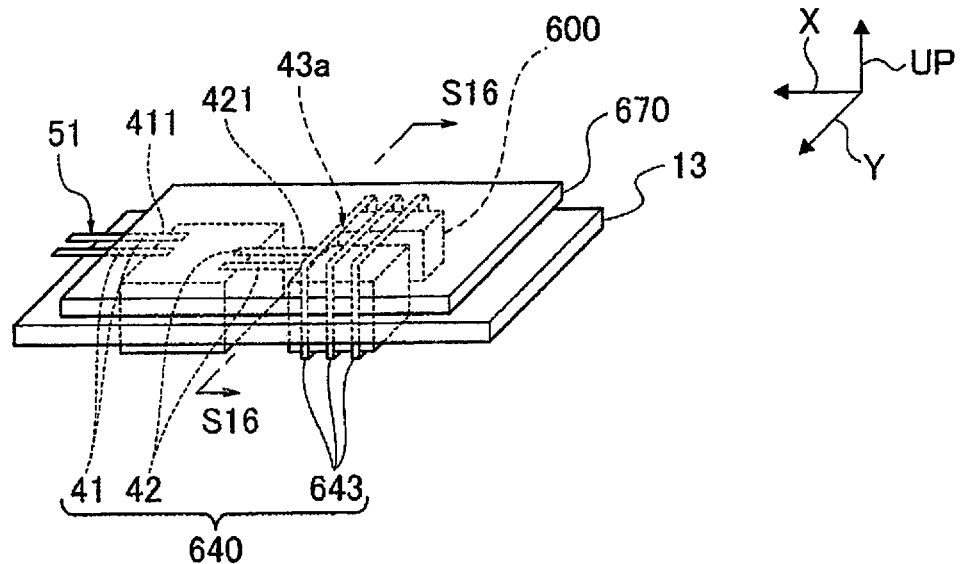
FIG. 15 is a perspective view of a lid portion, which is the main part of the inverter as an in-vehicle power conversion device according to a sixth embodiment.

The sixth embodiment is a modified example of the first embodiment and is different than the first embodiment in terms of the routing structure of the busbars 640, which is described below on the basis of FIG. 15 and FIG. 16. FIG. 15 is a cross-sectional view illustrating the main part of an inverter as an in-vehicle power conversion device according to the sixth embodiment, and FIG. 16 is a cross-sectional view illustrating the inverter of the sixth embodiment.

Figure 16:
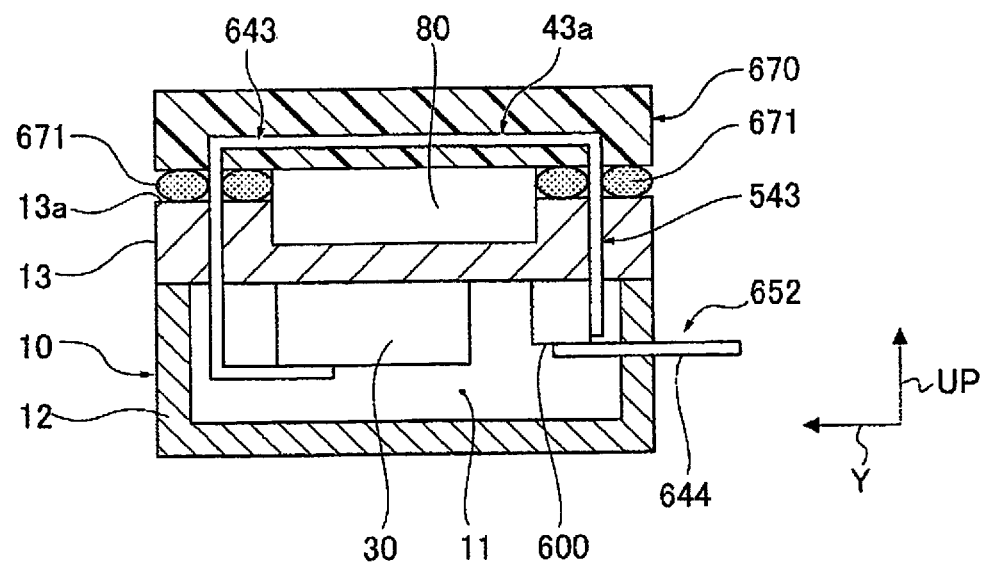
FIG. 16 is a cross-sectional view illustrating the inverter according to the sixth embodiment, showing a cross section through line S16-S16 of FIG. 15.

The third busbar 643 connects the lower portion of the power module 30 and a terminal block 600, as illustrated in FIG. 16. Here, the terminal block 600 is disposed at a position in a direction opposite to the connection position of the third busbar 643 and the power module 30 in the second direction (arrow y direction), with respect to the power module 30. Thus, the third busbar 643 extends through the lid body 13 upward, extends inside the busbar module 670 along the upper surface 13a of the lid body 13 and the refrigerant flow path 80, and then is suspended downward at the same horizontal position as the terminal block 600 to be connected to the terminal block 600. The portion of the third busbar 643 disposed inside the busbar module 670 is the heat-dissipating portion 43a.

A fourth busbar 644 is connected to the terminal block 600 to form a motor-side terminal part 652.

In this sixth embodiment, the seal between the refrigerant flow path 80 and the third busbar 643, the seal between the third busbar 643 and the outside of the casing 10, and between the lid body 13 and the busbar module 670 are carried out by sealing members 671 acting as partitioning members. This sealing member 671 is formed from an elastic material such as a rubber or a resin. The busbar module 670 is then fixed to the lid body 13 using a fastening element such as a bolt, which is not shown, and, once fastened, the sealing member 671 elastically deforms from the pressure applied imparting, thereby imparting a reliable sealing function.

As described above, since the heat-dissipating portion 43a is disposed outside of the casing 10, even if the connecting positions of the third busbar 643 with the smoothing capacitor 20 and with the terminal block 600 are separated, it is possible to connect the two without routing inside the housing portion 11 of the casing 10. Therefore, as described in 1) above, it is possible to reduce the size of the inverter and to improve design flexibility.

6-1) In the inverter of the sixth embodiment, a sealing member 671 as a partitioning member that seals the refrigerant flow path 80 is provided between the lid body 13 of the casing 10 and the heat-dissipating portion 43a.

Therefore, it is possible to ensure the watertightness of the refrigerant flow path 680 with the sealing member 671.

In addition, the sixth embodiment further comprises a sealing member 671 for sealing between the heat-dissipating portion 43a and the outside of the casing 10.

Therefore, it is possible to ensure the insulating and sealing functions of the heat-dissipating portion 43a.

Embodiment 7

Figure 17:
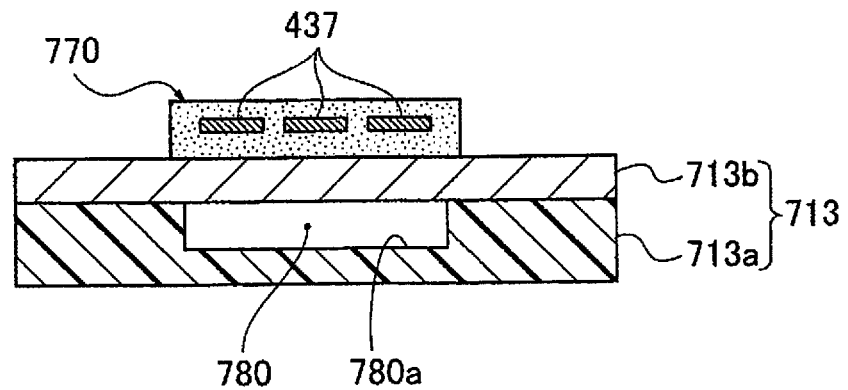
FIG. 17 is a cross-sectional view illustrating the main portion of the lid body of the inverter according to a seventh embodiment.

The seventh embodiment differs from the first embodiment in the structure of the lid body 713, and the configuration thereof will be described on the basis of FIG. 17. FIG. 17 is a cross-sectional view illustrating the main portion of the lid body of an inverter according to the seventh embodiment.

A lid body 713 of the casing 10 (not shown) is formed by vertically stacking a metal plate-shaped lid main body 713a and a metal plate-shaped upper side closing member 713b, as illustrated in FIG. 17.

In addition, a groove 780a that forms a refrigerant flow path 780 is formed on the lid main body 713a, and the refrigerant flow path 780 is formed by closing the groove 780a with the upper side closing member 713b.

The busbar module 770 is disposed above the refrigerant flow path 780 and is fixed to the upper surface of the upper side closing member 713b by means of adhesion or bonding, with the upper side closing member 713b serving as a heat sink portion.

7-1) In the inverter of the seventh embodiment,

An upper side closing member 713b as a member to which heat is transferred from the heat-dissipating portion 437 of the casing 10 also serves as a lid member that covers the refrigerant flow path 780.

Therefore, it is possible to efficiently cool the heat-dissipating portion 437.

Embodiment 8

Figure 18:
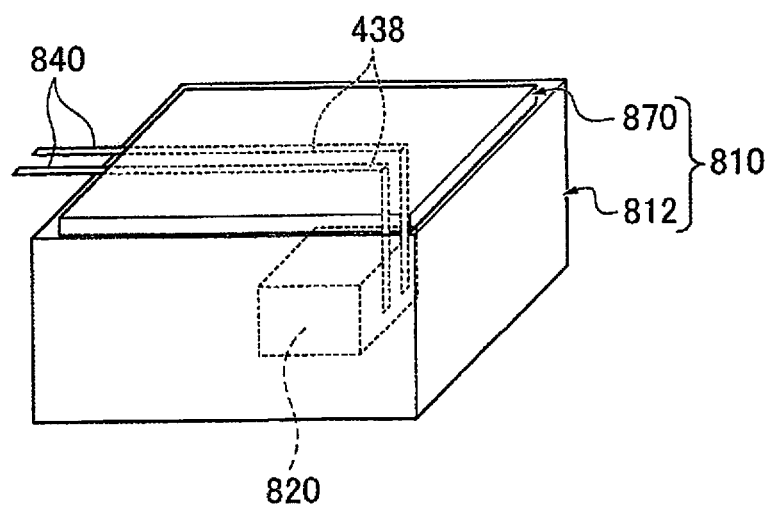
FIG. 18 is a perspective view illustrating an inverter as an in-vehicle power conversion device according to an eighth embodiment.

The eighth embodiment is an example in which the lid body of the casing 810 is formed from a busbar module 870, and the configuration thereof will be described on the basis of FIG. 18 and FIG. 19. FIG. 18 is a perspective view illustrating an inverter as an in-vehicle power conversion device according to the eighth embodiment, and FIG. 19 is a cross-sectional view illustrating the inverter of the eighth embodiment.

The casing 810 is formed from a main body 812 and a busbar module 870 serving as a lid body that closes an opening 812a thereof (refer to FIG. 18), as illustrated in FIG. 18.

Figure 19:
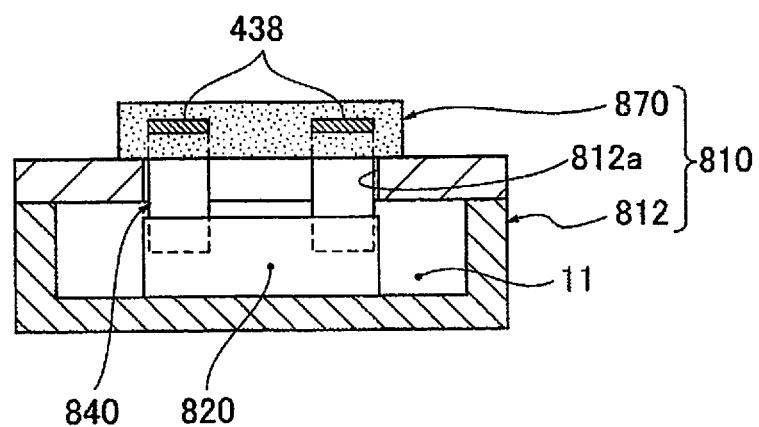
FIG. 19 is a cross-sectional view illustrating the inverter as an in-vehicle power conversion device according to the eighth embodiment.

The casing 810 is made of metal, in the form of a box shape, and has an opening 812a at the top, as illustrated in FIG. 19.

The busbars 840 connect a heavy-current system unit outside of the vehicle power conversion device such as an inverter and a drive unit 820 such as a power module inside of the casing 810. The busbars 840 are equipped with heat-dissipating portions 438 disposed along the casing 810 outside of the housing portion 11, outside of the casing 810.

The busbar module 870 has the shape of a rectangular thin plate made from an insulating resin that insulates the heat-dissipating portions 438, and the opening 812a of the main body 812 is closed by this plate-shaped busbar module 870.

8-1) In the in-vehicle power conversion device according to the eighth embodiment, the casing 810 includes a main body 812 that forms the housing portion 11 and a lid body for closing an opening 812a of the main body 812, and a busbar module 870 in which a heat-dissipating portion 438 of a busbar 840 and an insulating body are integrated is provided, and the busbar module 870 also serves as the lid body of the casing 810.

Therefore, in the eighth embodiment, it is possible to omit a dedicated lid body for the casing 810 and to reduce the number of parts, thereby decreasing costs.

The embodiments of the in-vehicle power conversion device of the present invention were described above, but specific configurations thereof are not limited to the described embodiments, and various modifications and additions to the design can be made without departing from the scope of the invention according to each claim of the Claims.

For example, in the embodiments, examples were shown in which the in-vehicle power conversion device according to the present invention is applied to an inverter; however, the present invention is not limited to an inverter and can be applied to other in-vehicle power conversion devices such as a converter. In addition, even when the in-vehicle power conversion device is used as an inverter, it is not limited to a three-phase inverter, as shown in the embodiments, but a single-phase inverter or an inverter with a plurality of phases other than three can be used.

Additionally, in the embodiments, examples were shown in which the casing is formed from metal, but the material is not limited to metal, and a resin, or the like, can be used therefor. When the casing is made from resin in this manner it is preferable to use a material that has excellent thermal conductivity for the portion to be used as a heat sink of the casing.

Furthermore, examples were shown in which, when the casing is used as a heat sink, the lid body is used as the location thereof, but no limitation is imposed thereby; the main body can be used as a heat sink and the heat-dissipating portions of the busbars can be disposed outside of the main body. In addition, examples were shown in which a refrigerant flow path is provided when the main body or the lid body is used as a heat sink, but no limitation is imposed thereby; cooling can be carried out simply by heat dissipation by means of heat transfer, without providing a refrigerant flow path.

Figure 20:
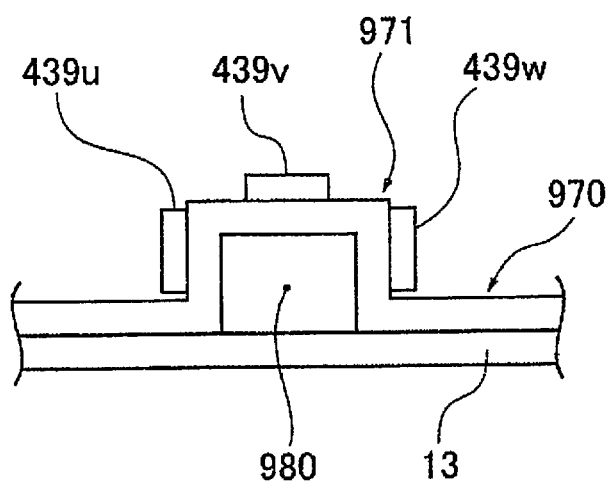
FIG. 20 is a cross-sectional view illustrating another example of an arrangement of the heat dissipation part of a busbar module.

Additionally, a busbar module integrated with an insulating resin was shown for insulating the heat-dissipating portions from the casing, but no limitation is imposed thereby; it is also possible to employ a structure in which an insulating material such as an insulating sheet is interposed between the busbars and the casing as a separate part. Furthermore, heat-dissipating portions of the busbars that are arranged in parallel along the horizontal direction with respect to the casing were shown, but the arrangement is not limited thereto; the heat-dissipating portions can be stacked. Alternatively, if the motor is a three-phase motor, a convex protrusion 971 can be provided on an insulating body (busbar module) 970, and busbars 439u, 439v, 439w can be provided on each of three surfaces of the protrusion, as illustrated in FIG. 20. A refrigerant flow path 980 is formed between the lid body 13 and the insulating body 970.

Furthermore, in the embodiments, a smoothing capacitor and a power module corresponding to a drive unit were shown as heat-generating parts, but heat-generating parts are not limited to smoothing capacitors and power modules; application can be made to other housing parts that generate heat.

Additionally, in the fourth embodiment, an example was shown in which a heat sink 400 is provided on the upper surface of the busbar module 370, above the heat-dissipating portion 431 (refer to FIG. 11 and FIG. 12). However, the installation position and the mode of installation of the heat sink is not limited thereto.

Figure 21:
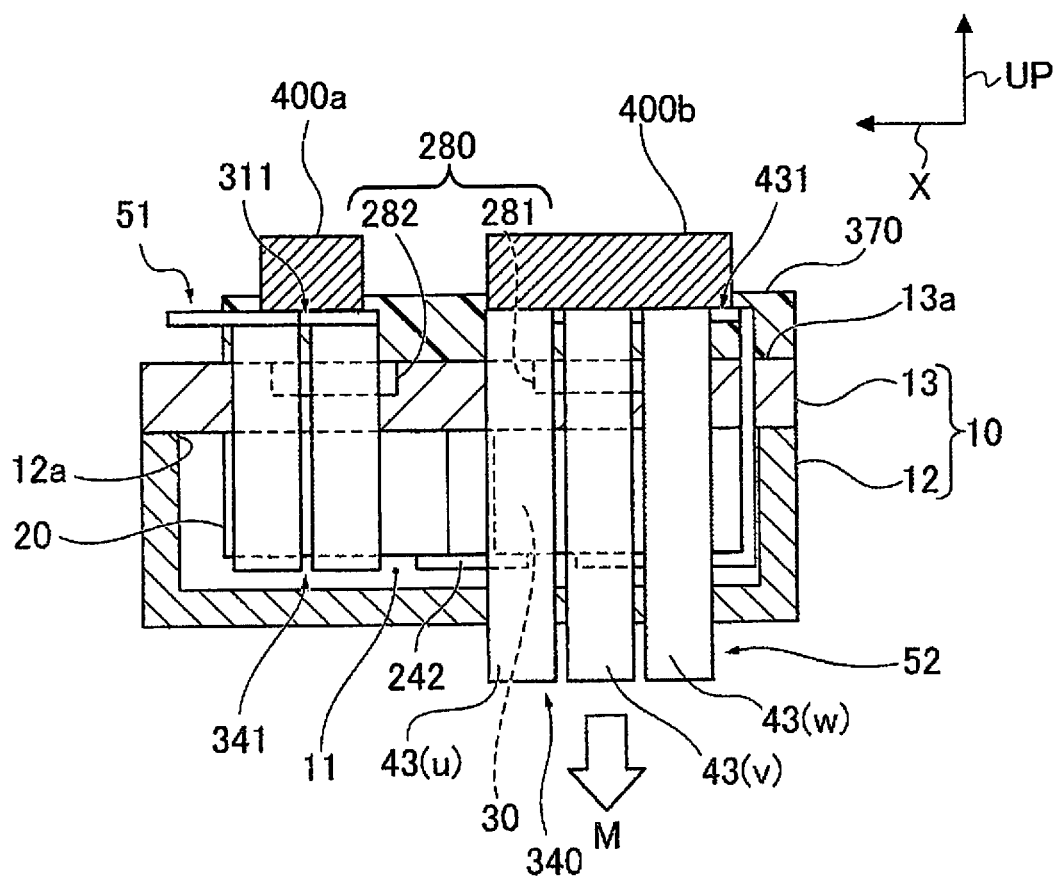
FIG. 21 is a cross-sectional view illustrating a modified example of the fourth embodiment.

FIG. 21 is a modified example of the fourth embodiment, in which heat sinks 400a, 400b are installed above two heat-dissipating portions 311, 431 of the busbar 340, abutting both heat-dissipating portions 311, 431. In this example, the heat dissipation of the first busbar 341 is also carried out by the heat sink 400a, and, since the two heat sinks 400a, 440b are respectively abutting the heat-dissipating portions 311, 431, the heat transfer efficiency is improved and the cooling performance can be improved.

The invention claimed is:

1. An in-vehicle power conversion device comprising:
   a drive unit that converts and transmits electric power;
   a casing including electrical input-output parts and a main body, the main body including a housing portion housing the drive unit and a lid body closing the housing portion;
   a plurality of busbars electrically connecting the drive unit and the electrical input-output parts of the casing to and from which the electric power is inputted and outputted, the electrical input-output parts being routed outside of the casing;
   the busbars comprising heat-dissipating portions that are arranged along the casing so as to transfer heat of self-heating of the busbars to the casing outside of the housing portion;
   a busbar module arranged to insulate the heat-dissipating portions from the casing and to form a refrigerant flow path between the casing and the busbar modules, and
   the refrigerant flow path being formed between and defined by the lid body and the busbar module.

2. The in-vehicle power conversion device as recited in claim 1, wherein the drive unit includes a heat-generating part arranged in the housing portion, heat of the heat-generating part and the heat from the heat-dissipating portions are transferred to a same portion of the casing.

3. The in-vehicle power conversion device as recited in claim 1, wherein
   the heat-dissipating portions also serve as a lid member that covers the refrigerant flow path.

4. The in-vehicle power conversion device as recited in claim 3, wherein
   the refrigerant flow path includes a second flow path for cooling a heat-generating part housed in the housing portion, and
   the heat-dissipating portions also serve as a lid member of the second flow path.

5. The in-vehicle power conversion device as recited in claim 3, further comprising
   a partitioning member for sealing the refrigerant flow path is provided between the casing and the heat-dissipating portions.

6. The in-vehicle power conversion device as recited in claim 3, wherein
   the casing and the heat-dissipating portions are joined to provide a joint portion for sealing the refrigerant flow path therebetween.

7. The in-vehicle power conversion device as recited in claim 6, wherein
   the joint portion is formed by adhering an insulating resin of the busbar module, in which the heat-dissipating portions and the insulating resin for insulating the heat-dissipating portions are integrated.

8. The in-vehicle power conversion device as recited in claim 1, wherein
   a portion of the casing to which the heat is transferred from the heat-dissipating portions also serves as a lid member that covers the refrigerant flow path.

9. The in-vehicle power conversion device as recited in claim 1, wherein
   the busbar module is formed integrally with an insulating body that insulates with respect to the casing.

10. The in-vehicle power conversion device as recited in claim 1, wherein
    a recessed groove is provided on the upper surface of the lid body for forming the refrigerant flow path, and the busbar module covers and closes an opening portion of the recessed groove.

11. An in-vehicle power conversion device comprising:
    a plurality of drive units that convert and transmit electric power;
    a casing including electrical input-output parts and a main body, the main body including a housing portion housing the plurality of drive units and a lid body closing the housing portion; and
    a plurality of busbars electrically connecting the plurality of drive units and the electrical input-output parts of the casing to and from which the electric power is inputted and outputted,
    the busbars comprising heat-dissipating portions that are arranged along the casing so as to transfer heat of self-heating of the busbars to the casing outside of the housing portion, and
    the busbars comprising the heat-dissipating portions include portions that are connected to the plurality of drive units that are housed in the housing portion to connect the drive units to each other.

12. The in-vehicle power conversion device as recited in claim 11, further comprising
    a busbar module having an insulating body that is arranged to insulate the heat-dissipating portions with respect to the casing.

13. The in-vehicle power conversion device as recited in claim 12, wherein
    the busbar module is in formed in a plate-like shape, and the heat-dissipating portions of the busbars are arranged in parallel inside the busbar module, and are bent into the form of an L along a plate surface of the busbar module.

14. The in-vehicle power conversion device as recited in claim 13, wherein the heat-dissipating portions are arranged to cross each other in a direction along the plate surface, while positions of the heat-dissipating portions along a direction orthogonal to the direction along the plate surface of the busbar module are varied, such that total lengths the heat-dissipating portions are substantially equal.

15. The in-vehicle power conversion device as recited in claim 12, wherein
    the busbar module forms the lid body.

16. The in-vehicle power conversion device as recited in claim 11, wherein
    the casing comprises a refrigerant flow path in a portion to which the heat is transferred from the heat-dissipating portions.

17. The in-vehicle power conversion device as recited in claim 11, wherein the plurality of drive units include a heat-generating part arranged in the housing portion, heat of the heat-generating part and the heat from the heat-dissipating portions are transferred to a same portion of the casing.

18. The in-vehicle power conversion device as recited in claim 17, further comprising
a busbar module having an insulating body that is arranged to insulate the heat-dissipating portions with respect to the casing.

19. The in-vehicle power conversion device as recited in claim 18, wherein
the busbar module is in formed in a plate-like shape, and
the heat-dissipating portions of the busbars are arranged in parallel inside the busbar module, and are bent into the form of an L along a plate surface of the busbar module.

20. The in-vehicle power conversion device as recited in claim 19, wherein the heat-dissipating portions are arranged to cross each other in a direction along the plate surface, while positions the heat-dissipating portions along a direction orthogonal to the direction along the plate surface of the busbar module are varied, such that total lengths the heat-dissipating portions are substantially equal.

21. The in-vehicle power conversion device as recited in claim 18, wherein
the busbar module forms the lid body.

* * * * *